United States Patent [19]

Lamb et al.

[11] Patent Number: 5,374,317
[45] Date of Patent: Dec. 20, 1994

[54] MULTIPLE REFLECTOR CONCENTRATOR SOLAR ELECTRIC POWER SYSTEM

[75] Inventors: Walter Lamb, Sunnyvale; John Lawrence, Cupertino, both of Calif.

[73] Assignee: Energy Systems Solar, Incorporated, Sunnyvale, Calif.

[21] Appl. No.: 35,914

[22] Filed: Mar. 23, 1993

Related U.S. Application Data

[63] Continuation of Ser. No. 853,348, Mar. 16, 1992, abandoned, which is a continuation of Ser. No. 588,567, Sep. 26, 1990, abandoned.

[51] Int. Cl.⁵ .................. H01L 31/052; H01L 31/058
[52] U.S. Cl. .................. 136/246; 136/248; 136/259; 126/685; 126/686; 126/687; 126/692
[58] Field of Search .............. 136/246, 248, 259; 126/685–687, 692

[56] References Cited

U.S. PATENT DOCUMENTS

| | | | |
|---|---|---|---|
| 3,018,313 | 1/1962 | Gattone | 136/246 |
| 3,070,699 | 12/1962 | Lehmann | 136/246 |
| 3,134,906 | 5/1964 | Henker | 136/246 |
| 3,152,926 | 10/1964 | Power | 136/246 |
| 3,232,795 | 2/1966 | Gillette | 136/246 |
| 3,350,234 | 10/1967 | Ule | 136/246 |
| 3,369,939 | 2/1968 | Myer | 136/246 |
| 3,376,165 | 4/1968 | Abbot | 136/246 |
| 3,383,246 | 5/1968 | Ferreira | 136/246 |
| 3,419,434 | 12/1968 | Colehower | 136/246 |
| 3,427,200 | 2/1969 | Lapin | 136/246 |
| 3,490,950 | 1/1970 | Myer | 136/246 |
| 3,515,594 | 6/1970 | Samuels | 136/246 |
| 3,532,551 | 10/1970 | Scott | 136/246 |
| 3,615,853 | 10/1971 | Goldsmith et al. | 136/246 |
| 3,769,091 | 10/1973 | Leinkram et al. | 136/246 |
| 3,833,425 | 9/1974 | Leinkram et al. | 136/246 |
| 3,971,672 | 7/1976 | Lampkin | 136/246 |
| 3,976,508 | 8/1976 | Mlavsky | 136/246 |
| 3,977,904 | 8/1976 | Kohler | 136/246 |
| 3,986,021 | 10/1976 | Hitchcock | 250/203.4 |
| 3,988,166 | 10/1976 | Beam | 136/246 |
| 3,990,914 | 11/1976 | Weinstein et al. | 136/246 |
| 3,994,012 | 12/1976 | Warner | 136/246 |
| 4,003,756 | 1/1977 | Abrams | 136/246 |
| 4,017,332 | 3/1977 | James | 136/246 |
| 4,021,267 | 5/1977 | Dettling | 136/246 |
| 4,042,417 | 8/1977 | Kaplow et al. | 136/246 |
| 4,045,246 | 8/1977 | Mlavsky | 136/246 |
| 4,052,228 | 11/1977 | Russell | 136/246 |
| 4,056,405 | 11/1977 | Varadi | 136/246 |
| 4,062,698 | 12/1977 | Blakeslee | 136/246 |
| 4,069,812 | 1/1978 | O'Neill | 136/246 |
| 4,075,034 | 2/1978 | Butler | 136/246 |
| 4,078,944 | 5/1978 | Mlavsky | 136/246 |
| 4,081,289 | 5/1978 | Campbell | 136/246 |
| 4,082,570 | 4/1978 | House | 136/246 |
| 4,116,718 | 6/1978 | Yerkes et al. | 136/246 |
| 4,118,249 | 10/1978 | Graven | 136/246 |
| 4,128,732 | 12/1978 | Kaplow et al. | 136/246 |
| 4,129,458 | 12/1978 | Kaplow et al. | 136/246 |
| 4,131,485 | 12/1978 | Meinel et al. | 136/259 |
| 4,140,142 | 2/1979 | Dormidontov | 136/246 |
| 4,144,095 | 3/1979 | Mlavsky | 136/246 |
| 4,146,407 | 5/1979 | Litsenko | 136/246 |
| 4,152,174 | 5/1979 | Ludlow | 136/246 |
| 4,153,474 | 5/1979 | Rex | 136/246 |
| 4,153,475 | 5/1979 | Hider et al. | 136/246 |
| 4,153,476 | 5/1979 | Shelpuk | 136/246 |
| 4,158,356 | 6/1979 | Wininger | 126/425 |
| 4,162,928 | 7/1979 | Shepard, Jr. | 136/246 |
| 4,169,738 | 10/1979 | Luque | 136/246 |
| 4,172,739 | 10/1979 | Tassen | 136/246 |
| 4,174,978 | 11/1979 | Lidorenko | 136/246 |
| 4,180,414 | 12/1979 | Diamond | 136/246 |
| 4,191,594 | 3/1980 | Stark | 136/246 |
| 4,200,472 | 4/1980 | Chappell et al. | 136/246 |
| 4,204,881 | 5/1980 | McGrew | 136/246 |
| 4,209,346 | 6/1980 | King | 136/246 |
| 4,209,347 | 6/1980 | Klein | 136/246 |
| 4,210,463 | 7/1980 | Escher | 136/246 |
| 4,223,174 | 9/1990 | Moeller | 136/246 |
| 4,234,354 | 11/1980 | Lidorenko | 136/246 |
| 4,235,643 | 11/1980 | Amick | 136/246 |
| 4,236,937 | 12/1980 | Wih | 136/246 |
| 4,242,580 | 12/1980 | Kaplow et al. | 250/203 R |
| 4,246,042 | 1/1981 | Knasel et al. | 136/246 |
| 4,263,895 | 4/1981 | Colao | 126/586 |
| 4,280,853 | 7/1981 | Palazzetti et al. | 136/246 |
| 4,283,588 | 8/1981 | Zitzelsberger | 136/246 |
| 4,284,839 | 8/1981 | Johnson | 136/246 |
| 4,289,920 | 9/1981 | Hovel | 136/246 |
| 4,291,191 | 9/1981 | Dahlberg | 136/246 |
| 4,301,321 | 11/1981 | Bartels | 136/246 |
| 4,311,869 | 1/1982 | Kurth et al. | 136/246 |

| Patent No. | Date | Inventor | Class |
|---|---|---|---|
| 4,313,023 | 1/1982 | Stephens | 136/246 |
| 4,316,448 | 2/1982 | Dodge | 126/424 |
| 4,321,417 | 3/1982 | Kurth et al. | 136/246 |
| 4,328,389 | 5/1982 | Peterson | 136/246 |
| 4,332,973 | 6/1982 | Sater | 136/246 |
| 4,337,758 | 7/1982 | Meinel et al. | 126/438 |
| 4,350,837 | 9/1982 | Clark | 136/246 |
| 4,361,717 | 11/1982 | Gilmore | 136/246 |
| 4,367,366 | 1/1983 | Bloss | 136/246 |
| 4,388,481 | 6/1983 | Uroshevich | 136/246 |
| 4,392,006 | 7/1983 | Apelian | 136/246 |
| 4,415,759 | 11/1983 | Copeland | 136/246 |
| 4,418,238 | 11/1983 | Lidorenko | 136/246 |
| 4,421,943 | 12/1983 | Withjack | 136/246 |
| 4,429,178 | 1/1984 | Prideaux et al. | 136/246 |
| 4,433,199 | 2/1984 | Middy | 136/246 |
| 4,454,371 | 6/1984 | Folino | 136/246 |
| 4,456,783 | 6/1984 | Baker | 136/246 |
| 4,482,778 | 11/1984 | Anderson | 136/246 |
| 4,491,681 | 1/1985 | Kirpich | 136/246 |
| 4,511,755 | 4/1985 | Mori | 136/246 |
| 4,529,829 | 7/1985 | Yamazaki | 136/246 |
| 4,529,830 | 7/1985 | Daniel | 136/246 |
| 4,567,316 | 1/1986 | Hollaus et al. | 136/246 |
| 4,577,052 | 5/1986 | Schutten et al. | 136/246 |
| 4,593,152 | 6/1986 | Yamazaki | 136/246 |
| 4,594,470 | 6/1986 | Headrick | 136/246 |
| 4,604,494 | 8/1986 | Shepard, Jr. | 136/246 |
| 4,622,432 | 11/1986 | Yamazaki | 136/246 |
| 4,628,142 | 12/1986 | Hashizume | 136/246 |
| 4,633,030 | 12/1986 | Cook | 136/246 |
| 4,638,110 | 1/1987 | Erbert | 136/246 |
| 4,668,841 | 5/1987 | Headrick | 136/246 |
| 4,670,622 | 6/1987 | Livingston, Jr. | 136/246 |
| 4,683,348 | 7/1987 | Pidgeon et al. | 136/246 |
| 4,687,880 | 10/1987 | Morris | 136/246 |
| 4,691,075 | 10/1987 | Murphy | 136/246 |
| 4,711,972 | 12/1987 | O'Neill | 136/246 |
| 4,716,258 | 12/1987 | Murtha | 136/246 |
| 4,724,010 | 2/1988 | Okaniwa et al. | 136/246 |
| 4,746,370 | 5/1988 | Woolf | 136/246 |
| 4,784,700 | 11/1988 | Stern et al. | 136/248 |
| 4,789,408 | 12/1988 | Fitzsimmons | 136/246 |
| 4,834,805 | 5/1989 | Erbert | 136/246 |
| 4,836,861 | 6/1989 | Peltzer et al. | 136/246 |

FOREIGN PATENT DOCUMENTS 3130226  2/1983  France .................. 136/246

OTHER PUBLICATIONS

"First Large-Scale Application of Promising Point-Contact Cell Technology Goes in PVUSA" *Photovoltaic Insider's Report,* vol. IX, No. 3 Mar. 1990, 1–6.

"Varian Develops High Efficiency Solar Cell" *Semiconductor International* (Jan. 1986), p. 16.

*Primary Examiner*—Aaron Weisstuch
*Attorney, Agent, or Firm*—Fliesler, Dubb, Meyer & Lovejoy

[57] ABSTRACT

Disclosed is a solar electric power system that utilizes multiple reflectors to concentrate sun light onto a panel of photovoltaic (PV) cells. The power system, consisting of multiple reflectors, mounted PV cells, and a heat dissipation component, is mounted on a tracker that keeps the system directed to the sun. A noteworthy feature of this system is its designed-in capability of being retrofitted with advanced reflectors, PV components, and heat dissipation components during the system's multi-year operating life. The common axes design feature of the system allows for low cost materials and manufacturing concepts. The system can operate on either a single or a dual axis tracker with active or passive cooling.

21 Claims, 7 Drawing Sheets

MULTIPLE REFLECTOR CONCENTRATOR SOLAR ELECTRIC POWER SYSTEM

This application is a continuation of Ser. No. 07/853,348, filed Mar. 16, 1992, now abandoned, which is a continuation of Ser. No. 07/588,567, filed Sep. 26, 1990, abandoned.

BACKGROUND

This invention relates generally to systems that generate electricity from the concentration of sunlight onto a photovoltaic semiconductor device, and more particularly to a low cost retrofitable multiple reflector system that can be modified on location to accommodate upgrades to its functional components.

Sunlight is a never ending source of energy that is available for conversion to electric power. The commercialization of solar electric power systems would avoid the disadvantages of other energy sources, such as air pollution, acid rain, the ozone problem, and nuclear waste. However, heretofore the cost of solar electric power has been too high to compete effectively with other types of electrical power generation, except in those relatively few instances where other types of commercially available power are not available, such as in remote locations.

Significant advancements for the efficient conversion of sunlight to electricity have been registered since the semiconductor revolution in the 1960's. As reported in Photovoltaic Insider's Report, March 1990, page 6, researchers at Stanford University, California, have increased the concentrated light solar cells' conversion efficiency to 28.5%. This is the best to-date reported for silicon. Varian Associates, California, has developed a multijunction solar cell with a 27.6% conversion efficiency, the highest "one sun" value reported to-date, as described in Semiconductor International, January 1990, page 16. These conversion efficiencies are adequate to allow solar electric power to meet the economic requirements necessary for commercialization, assuming that such highly efficient solar cells are reliable, can be manufactured at low cost, and can be integrated into reliable low cost systems.

Today, the terrestrial applications for solar electric products are restricted to those special uses where centralized network power is not practical, such as mountaintop microwave repeater stations, highway emergency telephones, and marine navigational aids. Prior art solar electric systems cannot compete economically with power generated by petroleum and coal for use in the central power networks due to the high cost of the solar electric power systems and their uncertain reliability.

In order for solar electric systems to become a valued contributor to central power networks on a cost effective basis, solar cell conversion efficiencies must remain high under production conditions, the associated solar electric system components must be low in cost, and all system components must be reliable enough to support the system's 30 year operating life. The commercialization of solar electric systems for central power network use will be determined by the system's cost per Kilowatt-hour of power generated over a 30 year period.

The most advanced prior art methods for concentrating sunlight onto photovoltaic products use a Fresnel lens or a curved (e.g. spherical, parabolic, or cylindrical) mirror. Each of these prior art design concepts have the limitation of requiring a tight alignment tolerance of a two axis solar tracker to keep the concentrated sunlight focused onto the photovoltaic component. The designed-in fixed size of the photovoltaic component is a further limitation of these prior art methods of light concentration. These prior art system designs have a further limitation in that they have a designed-in fixed concentration of sunlight which may be unsuitable to the requirements of the innovations in technology that are expected during the 30 year life of the solar power system. These prior art system designs do not lend themselves to low cost manufacturing concepts.

It seems likely that further technical advancements will be made in solar conversion photovoltaic products and light reflecting materials. Needed today is a solar electric power system designed to take advantage of the coming innovations in the performance and reliability of photovoltaic devices and light reflecting materials. Such a system design will provide assurance that the system will have a 30 year life because provisions for system upgrades to overcome component obsolescence will be a built-in feature of the design. The concentrator design of this invention carefully avoids those factors that impose limitations on the future use of this multiple reflector concentrator solar electric power system.

SUMMARY OF THE INVENTION

An objective of the present invention is to provide a solar concentrator or a solar electric power system that permits the retrofitting of components having different sizes.

Another objective of this invention is to provide a solar concentrator or a solar electric power system which permits the use of either a single or a dual axis sunlight tracker with a relatively high tolerance to reflector misalignment with the sun's rays.

Another objective of the invention is to provide a solar concentrator or a solar electric power system which allows the system to be manufactured at low cost.

In accordance with the present invention the scientific principles of folded optics, as exemplified by Cassegrain telescopes, are used to advantage in a solar energy system. The expense of components such as curved primary reflectors and wavelength dispersion by prisms as described by Stephan R. Clark in U.S. Pat. No. 4,350,837 is completely avoided. The complex, non-common axes of reflections and lack of secondary reflection to provide linear arrays of photovoltaic convertors for high power and efficiency of the R. Michael Murtha U.S. Pat. No. 4,716,258 are avoided.

In accordance with the teachings of this invention, a solar concentrator or a solar electric power system is taught in which all functionally active system components have common axes. As used in this context, "common axes" means the axes or long dimensions of components are parallel. Such system components include for example, single or multiple reflectors which concentrate the sunlight, one or more photovoltaic components which convert the concentrated solar energy to electrical energy, and one or more heat dissipation components which maintain the photovoltaic components sufficiently cooled to prevent their destruction, deterioration, or a decrease in their efficiency. The common axes feature permits each of the following: the retrofitting of system components having a non-original size, the use of a single or dual axis tracker of low alignment tolerance, and the use of low cost manufacturing concepts. This invention describes a light concentration scheme that utilizes multiple reflectors that have common axes so that these reflectors can be adjusted to accommodate changes in the size of upgraded photovoltaic components, can be replaced with upgraded reflectors as a means of sustaining or enhancing the peak output of the system, and can be composed or can be adjusted to regulate the amount of sunlight concentration. These reflector/concentrators can be treated with or incorporate a UV light modifying material to enhance the reliability of the photovoltaic components.

This invention applies to the system design features that permit the photovoltaic component to be selectively replaced with upgraded parts, even those having a different size from the original. This is made possible by the network of reflector/concentrators having the same axis as the photovoltaic component.

This invention describes a heat dissipation component that uses either or both active modes of conduction (e.g. a heat pump) and passive modes of conduction, (i.e. natural convection and radiation), thus requiring no moving parts. As noted above, the heat dissipating component has the same axis as the other active system components.

The common axes feature of the design makes possible the use of low cost manufacturing concepts such as the use of extruded parts, the use of flat plate reflector materials, and the retrofit expansion and modification of the power system using the same tracker.

The invention and objectives and features thereof will be more fully understood by the following detailed description and appended claims when taken with the drawings.

DETAILED DESCRIPTION

Figure 1:
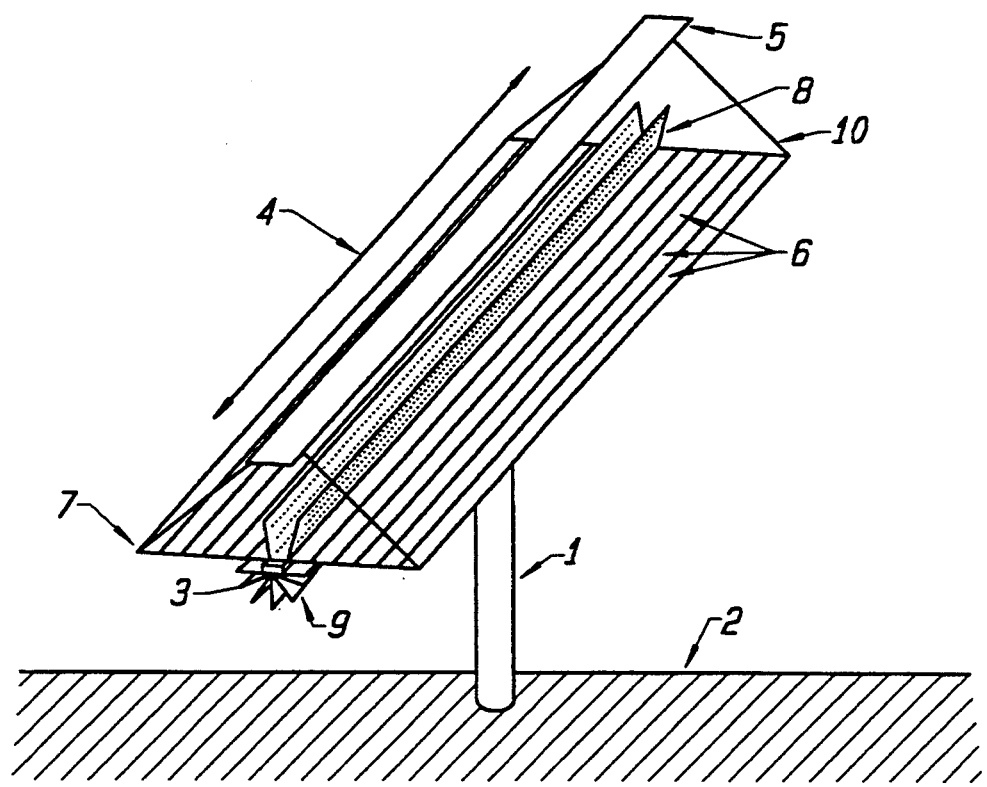
FIG. 1 is a functional schematic representation of one embodiment of a solar electric power system constructed in accordance with the teachings of this invention which includes one multiple reflector concentrator module with all functional components aligned to common axes.

FIG. 1 is a functional schematic representation of one embodiment of a multiple reflector concentrator solar electric power systems constructed in accordance with the teachings of this invention, which is attached to a single or dual axis tracker supported by pedestal 1 placed in earth 2. Use of a single or dual axis tracker control (not shown, but which may be of well known design such as those tracker control units which are commercially available, e.g. from Peerless Winsmith) keeps the sunlight focused on the line of the system's photovoltaic components 3 that lie on common axes 4 of multiple reflector concentrators 5, 6, and 8. The seasonal changes in the position of the sunlight are reduced in significance by the length of secondary reflectors 5 being greater than the length of the line of photovoltaic components 3 and the curvature of secondary reflectors 5 at their ends.

Also shown in FIG. 1 are several basic components of this embodiment of multiple reflector concentrator solar electric power system, such as the array of individual primary reflectors 6 arranged in plane 7, secondary reflectors 5 which collect the light from individual primary reflectors 6 and focus the light back past tertiary reflectors 8 which funnel the concentrated sunlight to photovoltaic component 3 which converts the solar energy to electricity and heat. The heat is dissipated by heat dissipation component 9. Secondary reflectors 5 are held in place by displacement arms 10. It will be appreciated that the arrangement of system components presented in FIG. 1 can be altered in a wide variety of manners, for example as described later in this specification, and not violate the stated objectives or the spirit of this invention.

In accordance with the teachings of this invention, the major functional system components, such as primary reflector 6, secondary reflectors 5, tertiary reflectors 8, photovoltaic component 3, and heat dissipation component 9 are each mounted along common axes 4. Mounting these functioning components along a common axes is a key feature of this invention, which makes possible the system's (a) reliable peak performance through the option to replace degraded or non-state of the art functional components with advanced components even if they are of a different size than the original components being replaced, (b) low cost manufacturing through the use of extruded parts and flat plate standard products, and (c) use of a single or dual axis tracker having a high alignment tolerance. These advantages provided in accordance with the teachings of this invention cannot be equalled by prior art designs based on the Fresnel lens or curved primary reflector concepts. An added feature of this invention is that the system's reflector concentration can be altered simply by the disengagement of one or more individual primary reflectors. This may become an important performance criteria of future advanced photovoltaic components which can easily be retrofitted into the system of this invention. The reflectors may be made of glass, metal, or polymer materials so long as they satisfy the high reflectivity, mechanical integrity, optical reliability, light frequency filtration, and cost objectives of the system. Photovoltaic components made of crystalline or amorphous materials, of silicon, III-V, or II-VI compound materials, having single or multiple junctions, having front side or back side contacts, are all usable in accordance with the teachings of this invention. Heat dissipation by the passive means shown in the schematic drawing of FIG. 1 can be replaced by an active cooling system without violating the spirit of this invention. The cooling system can include cogeneration of heat energy. The use of common axes 4 makes component retrofitting simple and a cost effective means of assuring the system's sustained peak performance for unlimited years.

Figure 2:
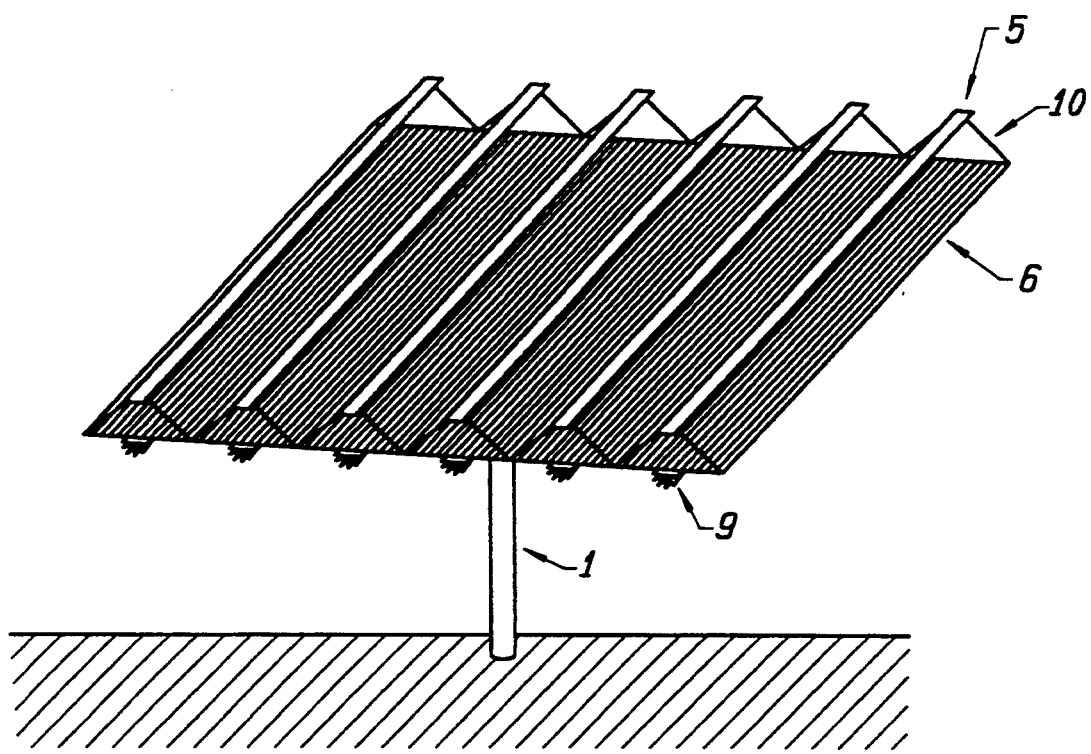
FIG. 2 is a functional schematic representation of one embodiment of a solar electric power system constructed in accordance with the teachings of this invention which includes six multiple reflector concentrator modules with all functional components aligned to common axes and supported by a single pedestal.

FIG. 2 is a functional schematic representation of one embodiment of a multiple reflector solar electric power system constructed in accordance with the teachings of this invention that identifies the parallel arrangements of six identical modules supported by a single pedestal 1. A multiple array of modules, in which each module is structured as shown in FIG. 1, can have any number of modules as required to satisfy a system power output and cost optimization requirement. Several of the module components in FIG. 1 are identified in FIG. 2: primary reflectors 6, secondary reflectors 5, heat dissipation component 9, and displacement arms 10.

Figure 3:
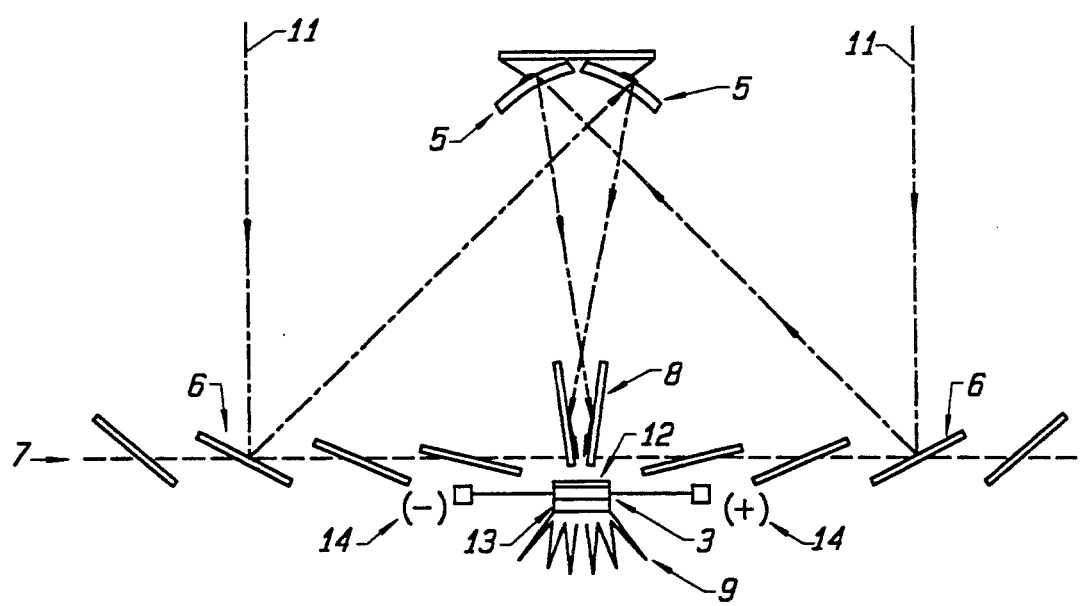
FIG. 3 is a cross sectional schematic representation of the functional components of one embodiment of the structure of FIG. 1 which is configured to use three functional groups of reflectors.

FIG. 3 is a cross sectional schematic representation of the functional, and retrofitable, components of the embodiment of FIG. 1 when energized by the sun's light rays 11. The sun's rays 11 first reach a plane 7 of individual primary reflectors 6 (which may be flat or curved), then are reflected to the location of secondary reflectors 5 (which may be flat or curved), then are reflected past tertiary reflectors 8, then pass through an optional cover plate 12, then reach photovoltaic component 3 which is attached to mount 13 which is attached to heat dissipation component 9. The electrical energy generated by photovoltaic component 3 passes through wires 14.

The placement of individual primary reflectors 6 in a plane 7 provides for low cost manufacturing methodologies. The angle of each individual primary reflector 6 is fixed to allow the sunlight to be reflected and concentrated, to the location of secondary reflectors 5 above plane 7 of primary reflectors 6. The amount of light concentration can be easily adjusted by inserting or removing one or more primary reflectors 6. This introduces a unique functional retrofitable feature to the multiple reflector design, since different photovoltaic components 3 are designed to operate at different levels of light concentration. The ability to increase the sunlight magnification is a unique feature of the concentrator system design taught by this invention, which can be activated during the seasons when sunlight intensity is less. Primary reflectors 6 are retrofitable so that their peak functional performance can be assured during the full life of the concentrator's use. Secondary reflectors 5 further reflect, and thus concentrate, the sunlight back to the near vicinity of primary reflectors 6 where tertiary reflectors 8 are located. Secondary reflectors 5 are adjustable so as to control the width of the light beam that reaches tertiary reflectors 8. This provides the concentrator system with a retrofitable feature that allows for the width of photovoltaic component 3 to be changed during the years of system operating life. A change in the width of photovoltaic component 3 may be required to upgrade the multiple reflector concentrator solar electric power system to use advanced photovoltaic cells that are yet to be designed. Such advanced photovoltaic cells may have a superior solar conversion efficiency or operating reliability.

As shown in FIG. 3, after the reflected sunlight leaves secondary reflectors 5 it passes, and may be partially reflected, by tertiary reflectors 8. Tertiary reflectors 8 are retrofittable and adjustable to provide a concentrator system constructed in accordance with this invention with assured extended operating life. The retrofittable feature provides for the future use of reflector materials that have a superior quality or shape. The sunlight 11 that passes tertiary reflectors 8 passes through an optional cover plate 12 that can be used to alter the UV segment of the light spectrum so as to improve the reliability of photovoltaic component 3 and improve the output of electricity from photovoltaic component 3. Cover plate 12 can also improve the reliability of the photovoltaic component 3 by restricting the incidence of unfavorable environmental factors such as rain and dust. Cover plate 12 is more easily cleaned and/or replaced, than is photovoltaic component 3. The retrofitable feature of cover plate 12 makes it possible to begin the concentrator's operating life with a cover plate 12 that addresses the UV problem during that period when the available photovoltaic cells 3 are vulnerable to UV degradation, and later replace cover plate 12 with a cover plate having different spectral transmissivity when new generations of photovoltaic products 3 are available which are not vulnerable to the UV segment of the light spectrums. Individual reflectors 5, 6, 8 of the concentrator can also be made to possess a UV light modifying feature. The light that passes through the location of cover plate 12 reaches photovoltaic component 3 that converts sunlight 11 to electrical and heat energy. The electrical energy is passed through wires 14 leading from photovoltaic component 3. Photovoltaic component 3 is attached to mount 13 that provides physical support to photovoltaic component 3 and transfers the heat energy to heat dissipation component 9. Photovoltaic component 3 and its associated mount 13 are retrofitable in accordance with the teachings of this invention, which permits the system to sustain maximum performance through the system's operating life. Replacement components can be introduced to overcome degraded parts or to simply take advantage of newer parts that evolve from advancing technologies. This system is designed to accept replacement photovoltaic component 3 and mount 13 of a size different from the original which greatly expands the opportunity to maintain the multiple reflector concentrator solar electric power system at a state of the art performance output.

The performance of photovoltaic component 3 decreases as the cell temperature increases, and thus heat dissipation component 9 performs an important function. FIG. 3 illustrates heat dissipation component 9 as a passive agent that cools by radiation, convection, and conduction through the use of no moving parts. The surface area of the extended fins is the dominant factor controlling the rate of heat dissipation. Preferably, heat dissipation component 9 is located in the shade provided by primary reflectors 6. This further enhances the effectiveness of heat dissipation component 9. Heat dissipation component 9 is retrofitable and expandable to be compatible with the size changes that may be made in photovoltaic component 3 and mount 13. Passive heat dissipation component 9 illustrated in FIG. 3, and described above can be replaced by an active coolant transfer system without deleteriously affecting the functional performance or scope of this invention.

It will be appreciated by those of ordinary skill in the art in the light of the teachings of his invention that the arrangement of system components presented in the embodiment depicted in FIG. 3 can be altered and not violate the stated objectives of this invention.

Figure 4:
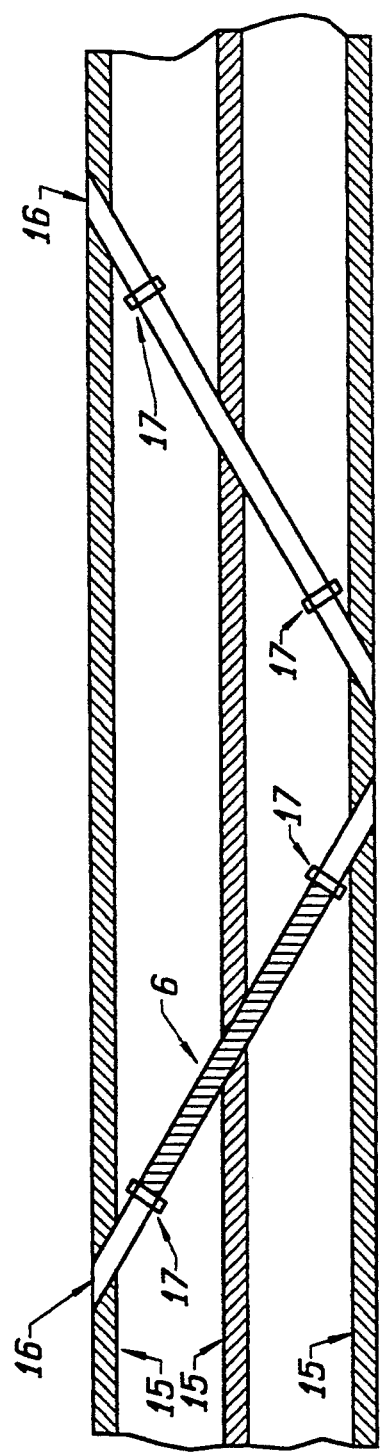
FIG. 4 depicts one embodiment of a fixture constructed in accordance with the teachings of this invention which holds the retrofitable primary reflectors of the embodiment of FIG. 3 in place and at the angle required to concentrate the sunlight to a focal line above the plane of the primary reflectors where the secondary reflectors or photovoltaic components may be positioned.

FIG. 4 depicts one embodiment of a fixture for holding primary reflectors 6, which includes structural frame 15, individual reflector rails 16, reflector positioning fixtures 17 and individual reflectors 6. Structural frame 15 is positioned at the two ends of the network of primary reflectors 6 which lie in a plane 7 as illustrated earlier in FIG. 1. The angle of each primary reflector 6 relative to other system components is determined by the orientation of the primary reflector's rail 16 along which primary reflector 6 can be slid in, or removed, as would be required to perform a retrofit or reduction in the system's design concentration. Rails 16 can be straight or curved to comply with the shape of primary reflectors 6. Reflector rails 16 have stopping devices 17 that assure that primary reflectors 6 are positioned exactly when being installed or retrofitted.

The multiple reflector embodiment shown in FIG. 3 depicts the secondary reflector 5 being placed at the focal line of primary reflectors 6. FIG. 1 shows secondary reflectors 5 as being held in place by displacement arms 10 which are attached to primary reflector frame 15. Secondary reflector 5 can consist of one or more curved reflectors. FIG. 3 depicts a dual secondary reflector 5 configuration which permits the adjustment of secondary reflector angle to change the width of the reflected light beam as it reaches the vicinity of photovoltaic component 3 located near the frame upon which are mounted primary reflectors 6. In one embodiment, individual primary reflectors 6 are positioned along a common center line, which is a feature favorable to allowing the assembly to be manufactured at low cost.

Figure 5:
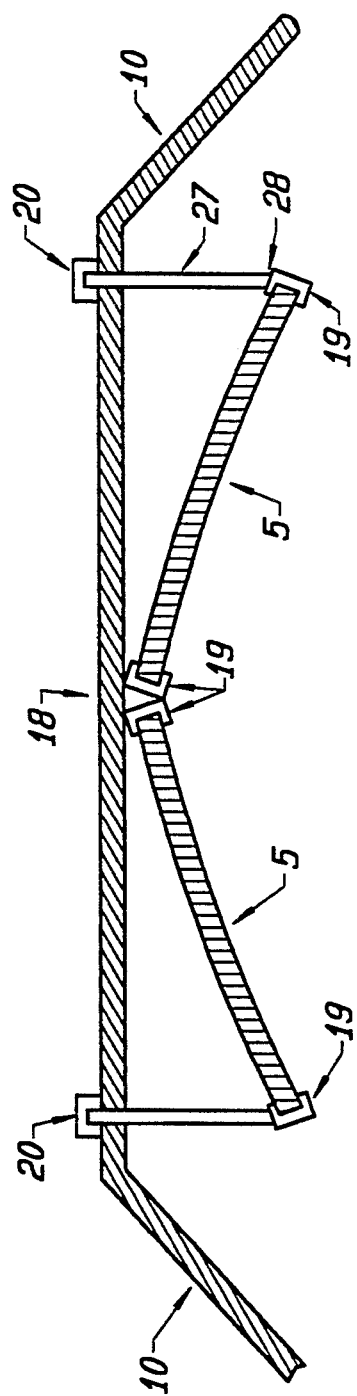
FIG. 5 illustrates one embodiment of a dual secondary reflector of FIG. 3, which allows the secondary reflectors to be retrofitted and orientation-adjusted to provide for a different width of reflected light beam focused to the photovoltaic components near the vicinity of the primary reflectors.

FIG. 5 shows one embodiment of dual secondary reflector component 5 of FIG. 3 in more detail. While a dual secondary reflector component 5 is shown in FIGS. 3 and 5, it is to be understood that a single secondary reflector component may be used in accordance with the teachings of this invention. Displacement arms 10 hold secondary reflector apparatus 18 in place. Railings 19, which hold secondary reflectors 5 in position and permit their retrofitting, are shown in cross section at the ends of secondary reflectors 5. Adjustment fixtures 20 are positioned to alter the angle of secondary reflectors 5, utilizing hinge 28 connecting railing 19 with an associated arm 27 of adjustment fixture 20, thus allowing the secondary reflector's transmitted beam width to be controlled. The width of the transmitted beam can also be controlled by extending the width of the primary and secondary reflectors or by modifying the angle of curvature of the secondary reflectors.

Figure 6:
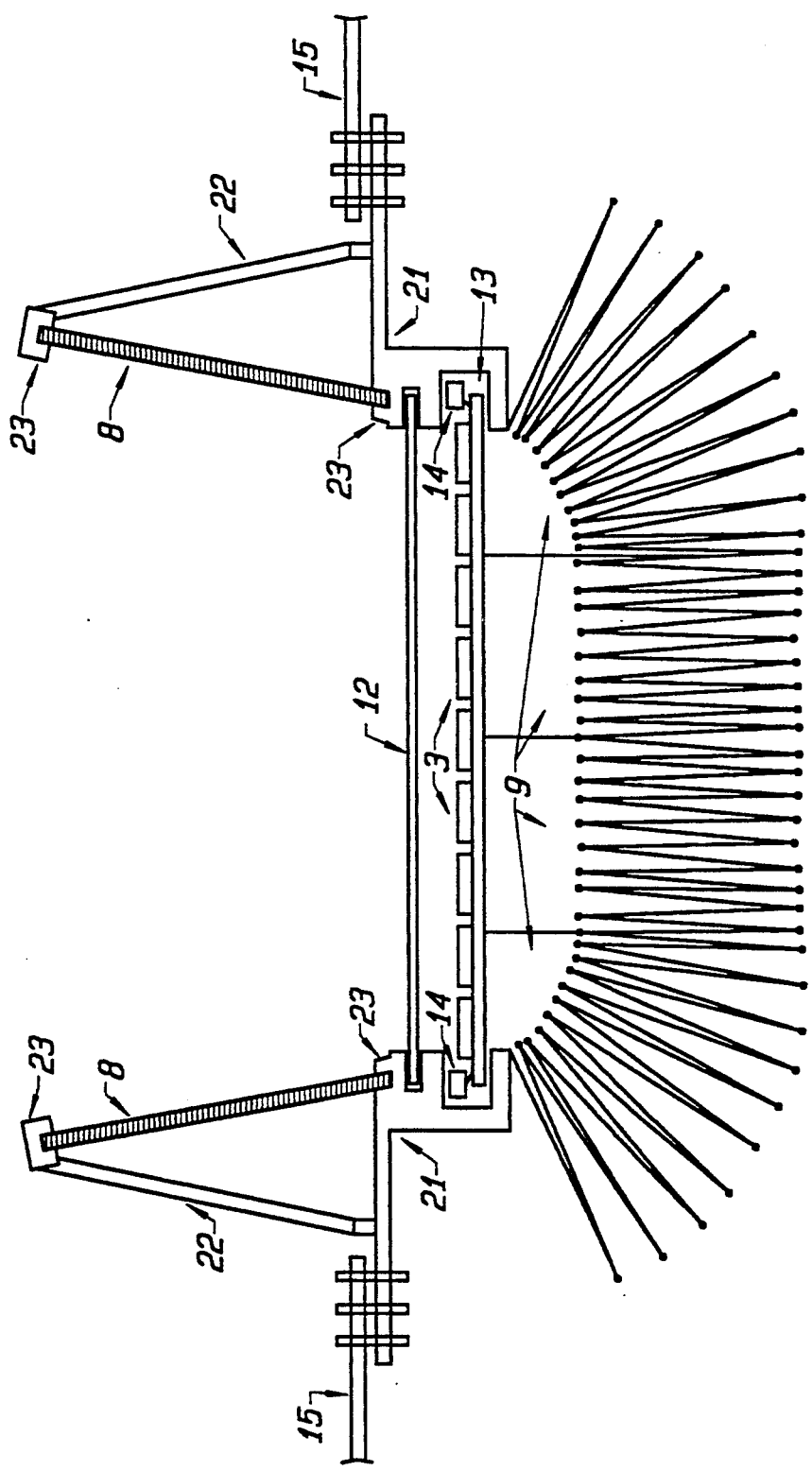
FIG. 6 is a cross sectional schematic representation of one embodiment of a system constructed in accordance with the teachings of this invention depicting the adjustable and retrofitable system components near the photovoltaic cells.

FIG. 6 is an end view schematic representation showing, for one embodiment of this invention, the relationship of several system components located in the near vicinity of photovoltaic component 3. One fundamental feature of the system components shown in FIG. 6 is the consistent provision in the design that permits the system to be adjusted to accommodate retrofitted components of size different from the original. In FIG. 6, photovoltaic component 3 is shown as a matrix of individual photovoltaic cells. The photovoltaic cells are shown to be attached to mount 13. Electrical wires or bars 14 that transmit the electricity from photovoltaic component are showns at the ends of photovoltaic component 3. Heat dissipation component 9 is shown to be attached to photovoltaic component mount 13. Heat dissipation component 9 is illustrated as comprising two center sections and two edge sections. The cost of the system can be kept low at its original construction and during its retrofitting of different sized components by designing in the use of standard products such as modular end and center sections of heat dissipation component 9. The width of heat dissipation component 9 can be increased to comply with an increase in the width of photovoltaic component 3 by simply inserting an additional center section module to heat dissipation component 9. A common fixture 21 is shown that holds in position cover slide 12, photovoltaic component 3, mount 13, heat dissipation component 9, and tertiary reflectors 8. Common support fixture 21 can be repositioned in its contact to primary reflector frame 15 to accommodate changes in the size of retrofitable components. A change in the width of the system components may require an adjustment to the angle of tertiary reflectors 8. This adjustment is accomplished by changing the length of adjustment arms 22 of tertiary reflectors 8. Tertiary reflectors 8 may be retrofitted during the operating life of the concentrator system. Tertiary reflectors 8 are mounted along railings 23 which permit an easy low cost capability for retrofitting.

Figure 7:
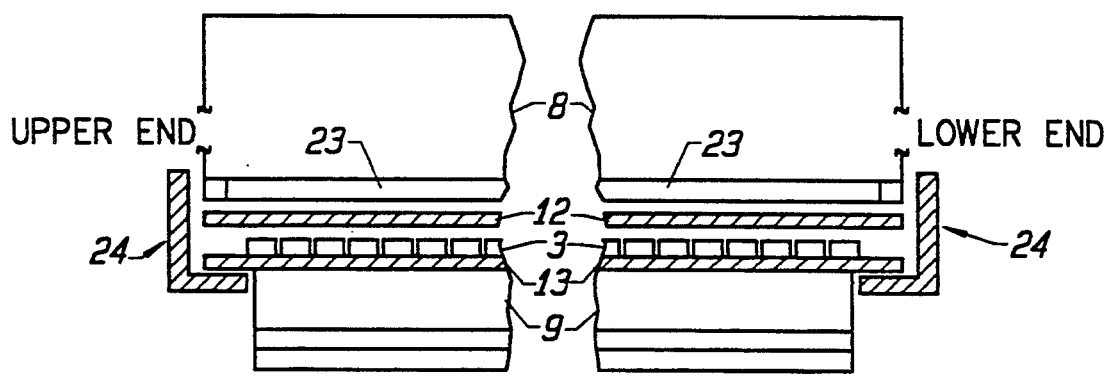
FIG. 7 is a cross sectional schematic representation of one embodiment of a system constructed in accordance with the teachings of this invention depicting fixtures at the upper and lower ends of the solar electric component.

FIG. 7 is a schematic representation showing, for one embodiment of this invention, the relationship of several of the components of the system shown in FIG. 6 in a side view cross section. The components shown in FIG. 6 include: tertiary reflector 8, cover plate 12, photovoltaic component 3, photovoltaic component mount 13, heat dissipation component 9, and tertiary reflector railing. The "L" fixture 24, which can be part of fixture 21 as shown in FIG. 6, located at the ends of the system components provides both physical and environmental protection to the system's active components.

All publications and patent applications are herein incorporated by reference to the same extent as if each individual publication or patent application was specifically and individually indicated to be incorporated by reference. While the Invention has been described with reference to specific embodiments, the description is illustrative of the invention and is not to be construed as limiting the scope of the Invention. Various modifications, changes, and applications may occur to those skilled in the art without departing from the true spirit and scope of the invention as defined by the appended claims. For example, while the various embodiments of this inventions described by way of example in this specification refer to the use of a photovoltaic component to convert solar energy into electricity, other devices can be readily employed to convert the concentrated solar energy provided in accordance with the teachings of this invention to provide other forms of useful energy, such as a heated fluid or gas, or the conversion of a fluid to a gas. Such other forms of useful energy can be used as is, or may in turn be converted to other forms of useful energy, including electricity.

What is claimed is:

1. A solar power system comprising:
 a photovoltaic component for converting solar energy to another form of energy; and
 means for reflecting sunlight onto said photovoltaic component, said reflecting means comprising:

a plurality of elongated, rectangular, flat, individually rotatable primary mirrors, each of said primary mirrors having a longitudinal centerline and an axis of rotation which is coextensive with said centerline;

first means for supporting said plurality of primary mirrors so that the longitudinal centerlines and the axes of rotation of all of said primary mirrors are located in substantially the same plane; and second means for supporting each of the primary mirrors so that each of said primary mirrors can be rotated about its axis of rotation independently of the other primary mirrors such that said plurality of primary mirrors provides a concentration of sunlight having a beam width which can be varied by rotating one or more of said primary mirrors to accommodate changes in the size of apparatus receiving said concentration of sun light;

means for supporting the photovoltaic component in a position flanked by said primary mirrors;

an individually rotatable secondary mirror for receiving said concentration of sunlight from the primary mirrors, said secondary mirror having a longitudinal centerline and an axis of rotation which is parallel to said centerline, first means for supporting a tertiary mirror on each side of said photovoltaic component, respectively, so that the axes of rotation of both of said tertiary mirrors are located in substantially the same plane, and second means for supporting said pair of tertiary mirrors so that each of said pair of tertiary mirrors can be rotated independently of the other of said tertiary mirrors about its axis of rotation to accommodate changes in the width of the photovoltaic component located therebetween such that both tertiary mirrors reflect onto said photovoltaic component whatever concentration of sunlight is received from said secondary mirror by said pair of tertiary mirrors.

2. A solar power system according to claim 1 wherein said means for supporting said photovoltaic component comprises:

a photovoltaic component mount having opposite edges for supporting said photovoltaic component therebetween;

a pair of fixtures, each of said fixtures having a slot located therein for receiving a corresponding edge of said photovoltaic component mount; and means for supporting said fixtures so that said fixtures can be moved laterally to accomodate a change in the width of said photovoltaic component mount, and wherein said first means for supporting one of said pair of mirrors on each side of said photovoltaic component comprises means for supporting said pair of mirrors on each of said fixtures, respectively; and wherein said second means for supporting said pair of mirrors so that each of said pair of mirrors can be rotated independently of the other mirror about its axis of rotation comprises an arm member for supporting the opposite edge of each of said pair of mirrors from each of said fixtures, respectively.

3. A solar power system comprising:

means for converting solar energy to another form of energy; and means for reflecting sunlight onto said converting means, said reflecting means comprising:

a plurality of elongated, rectangular, flat, individually rotatable primary mirrors, each of said primary mirrors having a longitudinal centerline and an axis of rotation which is coextensive with said centerline;

first means for supporting said plurality of primary mirrors so that the longitudinal centerlines and the axes of rotation of all of said primary mirrors are located in substantially the same plane; and second means for supporting each of the primary mirrors so that each of said primary mirrors can be rotated about its axis of rotation independently of the other primary mirrors such that said plurality of primary mirrors provides a first concentration of sunlight having a beam width which can be varied by rotating one or more of said primary mirrors to accommodate changes in the size of apparatus receiving said concentration of sun light;

a pair of elongated, rectangular, individually rotatable secondary mirrors for receiving said first concentration of sunlight with said beam width which can be varied, each of said secondary mirrors having a longitudinal centerline and an axis of rotation which is parallel to said centerline;

first means for supporting said plurality of secondary mirrors so that the axes of rotation of both of said secondary mirrors are located in substantially the same plane; and second means for supporting each of the secondary mirrors so that each of said secondary mirrors can be rotated independently of the other secondary mirror about its axis of rotation for reflecting onto said converting means a second concentration of sunlight with a beam width which can be varied by rotating one or both of said secondary mirrors to accommodate changes in the size of said converting means receiving said second concentration of sunlight.

4. A solar power system according to claim 3 wherein said means for reflecting sunlight onto said converting means further comprises:

a pair of elongated, rectangular, flat, individually rotatable tertiary mirrors, each of said tertiary mirrors having a longitudinal centerline and an axis of rotation which is parallel to said centerline;

first means for supporting said pair of tertiary mirrors so that the axes of rotation of both of said tertiary mirrors are located in substantially the same plane; and second means for supporting each of the tertiary mirrors so that each of said tertiary mirrors can be rotated independently of the other tertiary mirror about its axis of rotation to accommodate changes in the size of the converting means receiving said second concentration of sunlight such that both tertiary mirrors reflect onto said converting means whatever second concentration of sunlight is received by the tertiary mirrors.

5. A solar power system according to claim 4 wherein said means for converting solar energy to another form of energy comprises a photovoltaic component and further comprising means for dissipating heat from said photovoltaic component.

6. A solar power system according to claim 5 wherein said means for dissipating heat from said photovoltaic component comprises a modular construction to facilitate the expansion and contraction of the size of the heat dissipating means as a function of a change in the size of the photovoltaic component.

7. A solar power system according to claim 4 wherein said means for converting solar energy to another form of energy comprises a photovoltaic component located at the base of said tertiary mirrors.

8. A solar power system according to claim 7 wherein said means for converting solar energy to another form of energy comprises a cover for protecting said photovoltiac component from adverse environmental conditions and/or adverse electromagnetic radiation.

9. A solar power system according to claim 7 wherein said photovoltaic component and said tertiary mirrors are located in the vicinity of the center of said plurality of primary mirrors.

10. A solar power system comprising:
means for converting solar energy to another form of energy; and
means for reflecting sunlight onto said converting means, said reflecting means comprising:
a plurality of elongated, rectangular, flat, individually rotatable primary mirrors, each of said primary mirrors having a longitudinal centerline and an axis of rotation which is coextensive with said centerline;
first means for supporting said plurality of primary mirrors so that the longitudinal centerlines and the axes of rotation of all of said primary mirrors are located in substantially the same plane;
second means for supporting each of the primary mirrors so that each of said primary mirrors can be rotated about its axis of rotation independently of the other primary mirrors such that said plurality of primary mirrors provides a concentration of sunlight having a beam which can be varied by rotating one or more of said primary mirrors to accommodate changes in the size of apparatus receiving said concentration of sunlight;
a pair of elongated, rectangular, individually rotatable secondary mirrors for receiving said first concentration of sunlight with said beam width which can be varied, each of said secondary mirrors having a longitudinal centerline and an axis of rotation which is parallel to said centerline;
first means for supporting said plurality of secondary mirrors so that the axes of rotation of both of said secondary mirrors are located in substantially the same plane; and
second means for supporting each of the secondary mirrors so that each of said secondary mirrors can be rotated independently of the other secondary mirror about its axis of rotation for reflecting onto said converting means said second concentration of sunlight with a beam width which can be varied by rotating one or both of said secondary mirrors to accommodate changes in the size of said converting means receiving said second concentration of sunlight.

11. A solar power system according to claim 10 wherein said means for converting solar energy to another form of energy comprises:
a photovoltaic component; and
means for supporting the photovoltaic component in a position flanked by said primary mirrors; and, wherein said means for reflecting sunlight onto said converting means further comprises:
a pair of elongated, rectangular, flat, individually rotatable tertiary mirrors, each of said pair of tertiary mirrors having a longitudinal centerline and an axis of rotation which is parallel to said centerline;
first means for supporting one of said pair of tertiary mirrors on each side of said photovoltaic component, respectively, so that the axes of rotation of both of said tertiary mirrors are located in substantially the same plane; and
second means for supporting said pair of tertiary mirrors so that each of said pair of tertiary mirrors can be rotated independently of the other mirror about its axis of rotation to accommodate changes in the width of the photovoltaic component located therebetween such that both tertiary mirrors reflect onto said photovoltaic component whatever concentration of sunlight is received by said pair of tertiary mirrors.

12. A solar power system according to claim 11 wherein said means for supporting said photovoltaic component comprises:
a photovoltaic component mount having opposite edges for supporting said photovoltaic component therebetween;
a pair of fixtures, each of said fixtures having a slot located therein for receiving a corresponding edge of said photovoltaic component mount; and
means for supporting said fixtures so that said fixtures can be moved laterally to accomodate a change in the width of said photovoltaic component mount, and wherein said first means for supporting one of said pair of tertiary mirrors on each side of said photovoltaic component comprises means for supporting said pair of tertiary mirrors on each of said fixtures, respectively; and wherein said second means for supporting said pair of tertiary mirrors so that each of said pair of tertiary mirrors can be rotated independently of the other mirror about its axis of rotation comprises an arm member for supporting the opposite edge of each of said pair of tertiary mirrors from each of said fixtures, respecively.

13. A solar power system according to claim 10 wherein said means for converting solar energy to another form of energy comprises a photovoltaic component and further comprising means for dissipating heat from said photovoltaic component.

14. A solar power system according to claim 13 wherein said means for dissipating heat from said photovoltaic component comprises a modular construction to facilitate the expansion and contraction of the size of the heat dissipating means as a function of a change in the size of the photovoltaic component.

15. A solar power system according to claim 13 further including a cover for protecting said photovoltiac component from adverse environmental conditions and/or adverse electromagnetic radiation.

16. A solar power system comprising:
means for converting solar energy to another form of energy; and
means for reflecting sunlight onto said converting means, said reflecting means comprising:
a plurality of elongated, rectangular, flat, individually rotatable primary mirrors, each of said primary mirrors having a longitudinal centerline and an axis of rotation which is coextensive with said centerline;
first means for supporting said plurality of primary mirrors so that the longitudinal centerlines and the axes of rotation of all of said primary mirrors are located in substantially the same plane;

second means for supporting each of the primary mirrors so that each of said primary mirrors can be rotated about its axis of rotation independently of the other primary mirrors such that said plurality of primary mirrors provides a concentration of sunlight having a beam which can be varied by rotating one or more of said primary mirrors to accommodate changes in the size of apparatus receiving said concentration of sunlight;

a pair of elongated, rectangular, individually rotatable secondary mirrors for receiving said first concentration of sunlight with said beam width which can be varied, each of said secondary mirrors having a longitudinal centerline and an axis of rotation which is parallel to said centerline;

first means for supporting said plurality of secondary mirrors so that the axes of rotation of both of said secondary mirrors are located in substantially the same plane;

second means for supporting each of the secondary mirrors so that each of said secondary mirrors can be rotated independently of the other secondary mirror about its axis of rotation for providing a second concentration of sunlight with a beam width which can be varied by rotating one or both of said secondary mirrors to accommodate changes in the size of said converting means receiving said second concentration of sunlight;

a pair of elongated, rectangular, flat, individually rotatable tertiary mirrors for receiving said second concentration of sunlight with said beam width which can be varied, each of said tertiary mirrors having a longitudinal centerline and an axis of rotation which is parallel to said centerline;

first means for supporting said plurality of tertiary mirrors so that the axes of rotation of both of said tertiary mirrors are located in substantially the same plane; and second means for supporting each of the tertiary mirrors so that each of said tertiary mirrors can be rotated independently of the other tertiary mirror about its axis of rotation to accommodate changes in the size of the converting means such that both tertiary mirrors reflect onto said converting means whatever second concentration of sunlight is received by the tertiary mirrors.

17. A solar power system according to claim 16 wherein said means for converting solar energy to another form of energy comprises a photovoltaic component located at the base of said tertiary mirrors.

18. A solar power system according to claim 17 wherein said photovoltaic component and said tertiary mirrors are located in the vicinity of the center of said plurality of primary mirrors.

19. A solar power system according to claim 17 wherein said means for converting solar energy to another form of energy comprises means for dissipating heat from said photovoltaic component.

20. A solar power system according to claim 19 wherein said means for dissipating heat from said photovoltaic component comprises a modular construction to facilitate the expansion and contraction of the size of the heat dissipating means as a function of a change in the size of the photovoltaic component.

21. A solar power system according to claim 20 wherein said means for converting solar energy to another form of energy comprises a cover for protecting said photovoltiac component from adverse environmental conditions and/or adverse electromagnetic radiation.

* * * * *